(12) United States Patent
Huang et al.

(10) Patent No.: US 8,406,825 B2
(45) Date of Patent: Mar. 26, 2013

(54) INTEGRATED ANTENNA AND ELECTROSTATIC DISCHARGE PROTECTION

(75) Inventors: Qian Huang, Waterloo (CA); Rongrong Zhang, Kitchener (CA); Yihong Qi, Waterloo (CA); Perry Jarmuszewski, Waterloo (CA)

(73) Assignee: Research In Motion Limited, Waterloo (CA)

( * ) Notice: Subject to any disclaimer, the term of this patent is extended or adjusted under 35 U.S.C. 154(b) by 663 days.

(21) Appl. No.: 12/533,119

(22) Filed: Jul. 31, 2009

(65) Prior Publication Data

US 2011/0028191 A1 Feb. 3, 2011

(51) Int. Cl.
*H04W 1/00* (2006.01)
(52) U.S. Cl. .......... 455/575.1; 455/301; 455/562.1; 455/575.7
(58) Field of Classification Search ........ 455/575.7, 455/562.1, 301, 575.1, 575.5
See application file for complete search history.

(56) References Cited

U.S. PATENT DOCUMENTS

| 5,802,458 A | 9/1998 | Van Zeijl | |
|---|---|---|---|
| 6,271,794 B1 * | 8/2001 | Geeraert | 343/700 MS |
| 6,937,205 B2 | 8/2005 | Chou et al. | |
| 7,233,678 B2 | 6/2007 | Erixon et al. | |
| 7,398,072 B2 * | 7/2008 | Corrigan et al. | 455/301 |
| 2002/0187758 A1 | 12/2002 | Ylitalo | |
| 2006/0284770 A1 * | 12/2006 | Jo et al. | 343/700 MS |
| 2007/0238495 A1 * | 10/2007 | Hawker et al. | 455/575.5 |
| 2007/0273602 A1 | 11/2007 | Zhu et al. | |
| 2008/0055163 A1 | 3/2008 | Man et al. | |
| 2008/0227506 A1 * | 9/2008 | Corrigan et al. | 455/575.5 |
| 2008/0246678 A1 | 10/2008 | Rao et al. | |
| 2009/0005110 A1 | 1/2009 | Ozden | |
| 2009/0051595 A1 | 2/2009 | Wang et al. | |

FOREIGN PATENT DOCUMENTS

| DE | 60204204 | 2/2006 |
|---|---|---|
| EP | 1258943 | 11/2002 |
| WO | WO 00/35124 | 6/2000 |
| WO | WO0074172 | 12/2000 |
| WO | WO 2007129410 | 11/2007 |

* cited by examiner

*Primary Examiner* — Amancio Gonzalez
(74) *Attorney, Agent, or Firm* — Ridout & Maybee LLP

(57) ABSTRACT

A mobile communications device having an antenna partly formed from an electrostatic discharge shield covering a microphone. The antenna includes a radiator arm extending from the electrostatic discharge shield and includes a feed element connecting the electrostatic discharge shield to a signal trace. To the extent the microphone employs an acoustic tube to form an acoustic pathway between the device casing and the microphone, the radiator arm of the antenna may be arranged over the acoustic tube.

14 Claims, 5 Drawing Sheets

INTEGRATED ANTENNA AND ELECTROSTATIC DISCHARGE PROTECTION

FIELD

The present application generally relates to an antenna and, in particular, to an antenna integrated with an electrostatic discharge protection shield and devices that include an antenna integrated with an electrostatic discharge protection shield.

BACKGROUND

As consumer electronics devices become more compact and achieve greater functionality, it has become increasingly difficult to arrange the interior components to realize higher density. This is especially so with wireless communications devices, including handheld devices, personal digital assistants, mobile smartphones, etc., where the devices are increasingly compact, yet include a greater number of components and features than ever before. Many such devices now include keyboards, cameras, trackballs, display screens (ordinary or touchscreen), memory cards, speakers, microphones, I/O jacks, and multiple antennas, for cellular, IEEE 802.11, Bluetooth®, GPS, and other radio frequency communications. This has made the configuration of the components challenging and puts circuit board space at a premium.

It would be advantageous to provide for an electronic device having a new configuration of components that permits greater density.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
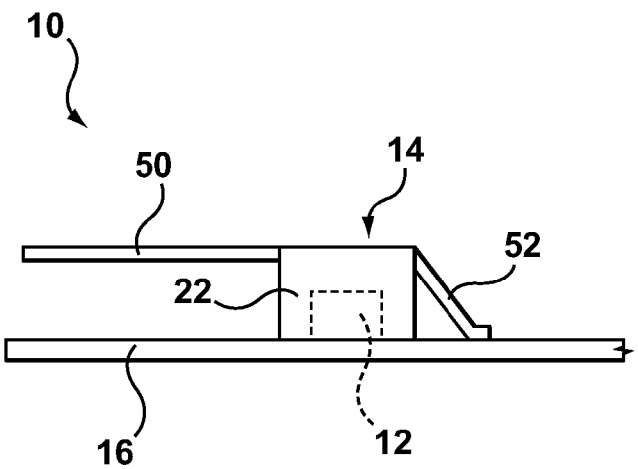
FIG. 1 shows a side view of one embodiment of an antenna integrated with ESD protection.

The present application describes an antenna partly formed from the electrostatic discharge shield covering a microphone in an electronic device. By exploiting the presence of the electrostatic discharge shield and using it as the shorting element in the antenna, space is saved. Moreover, to the extent the microphone employs an acoustic tube to form an acoustic pathway between the device casing and the microphone, the radiator arm of the antenna integrally formed with the electrostatic discharge shield may be arranged over the acoustic tube, which results in an efficient arrangement of elements.

In one aspect, the present application describes a handheld electronic device. The device includes a substrate having a ground plane and an antenna signal trace; a microphone mounted to the substrate; a metallic shield disposed over the microphone and being connected to the ground plane; and a radio frequency antenna formed in part from the metallic shield and having at least one radiator arm connected to the metallic shield. The antenna includes a feed point connected to the antenna signal trace.

In another aspect, the present application describes a mobile communications device. The device includes a device casing having an acoustic microphone opening; a substrate within the device casing, the substrate having an electrical ground and a signal trace; a microphone mounted to the substrate; an electrostatic discharge shield disposed over the microphone and connected to the electrical ground, the electrostatic discharge shield defining an acoustic port; and an antenna having a radiator arm and a feed element both connected to the electrostatic discharge shield, and wherein the feed element is further connected to the signal trace.

Many electronics devices include an antenna for radio frequency communications, including mobile devices, laptop computers, desktop computers, smartphones, personal digital assistants, and many other such devices. Many of these devices also include a microphone that functions to receive audio input and convert the audio to electrical signals that are processed by the device. In many cases, the microphone serves to permit voice communications, such as in a mobile telephone and other devices configured for wireless communications.

Microphones are transducers that require exposure to the environment in order to receive acoustic signals. The environment can also have a detrimental impact on microphones, as they become exposed to environmental hazards such as human liquids or oils. Accordingly, in some cases microphones are encased in a sealed rubber covering, except for an opening (i.e. a port or hole) through which acoustic waves are to be received. A gasket or "rubber boots" may be used to seal the port or hole to the exterior casing of the electronic device.

Microphones and their associated coder/decoder (CODEC) integrated circuits (ICs) are also vulnerable to electrostatic discharge (ESD). Techniques that have been developed for protecting microphones from electrostatic discharge include covering the microphone (except the acoustic opening/port) with a grounded casing or shield. Alternatively or additionally, transient voltage suppressor (TVS) diodes may be added to the microphone circuit to absorb ESD events. Adding TVS diodes can be costly and may negatively impact the performance of the audio circuits.

Reference is now made to FIG. 1, which shows a side view of one embodiment of an antenna 10 integrated with ESD protection. The antenna 10 is formed partly with an ESD shield (generally 14) over a microphone 12. The microphone 12 is illustrated in phantom lines. The microphone 12 is mounted or connected to a printed circuit board 16 or other substrate. In this application, the term "substrate" is intended to encompass printed circuit boards and any other such substrate on which electrical components may be assembled and interconnected to form an electronic device. The printed circuit board 16 includes a ground connection or plane (not illustrated). The microphone 12 is connected to suitable audio circuitry and a CODEC IC for receiving and processing signals from the microphone 12. In one embodiment, the microphone 12 is an Electret Condenser Microphone (ECM), however in other embodiments other types of microphones may be used.

Figure 2:
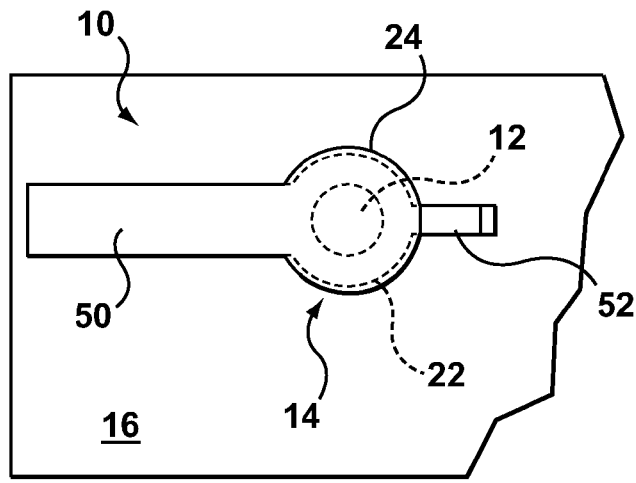
FIG. 2 shows a top planar view of the antenna of FIG. 1.
Figure 3:
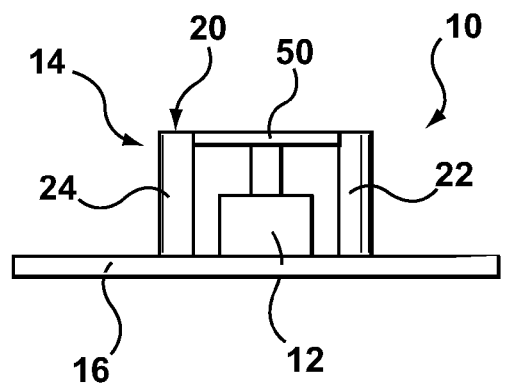
FIG. 3 shows a front view of the antenna of FIG. 1.
Figure 4:
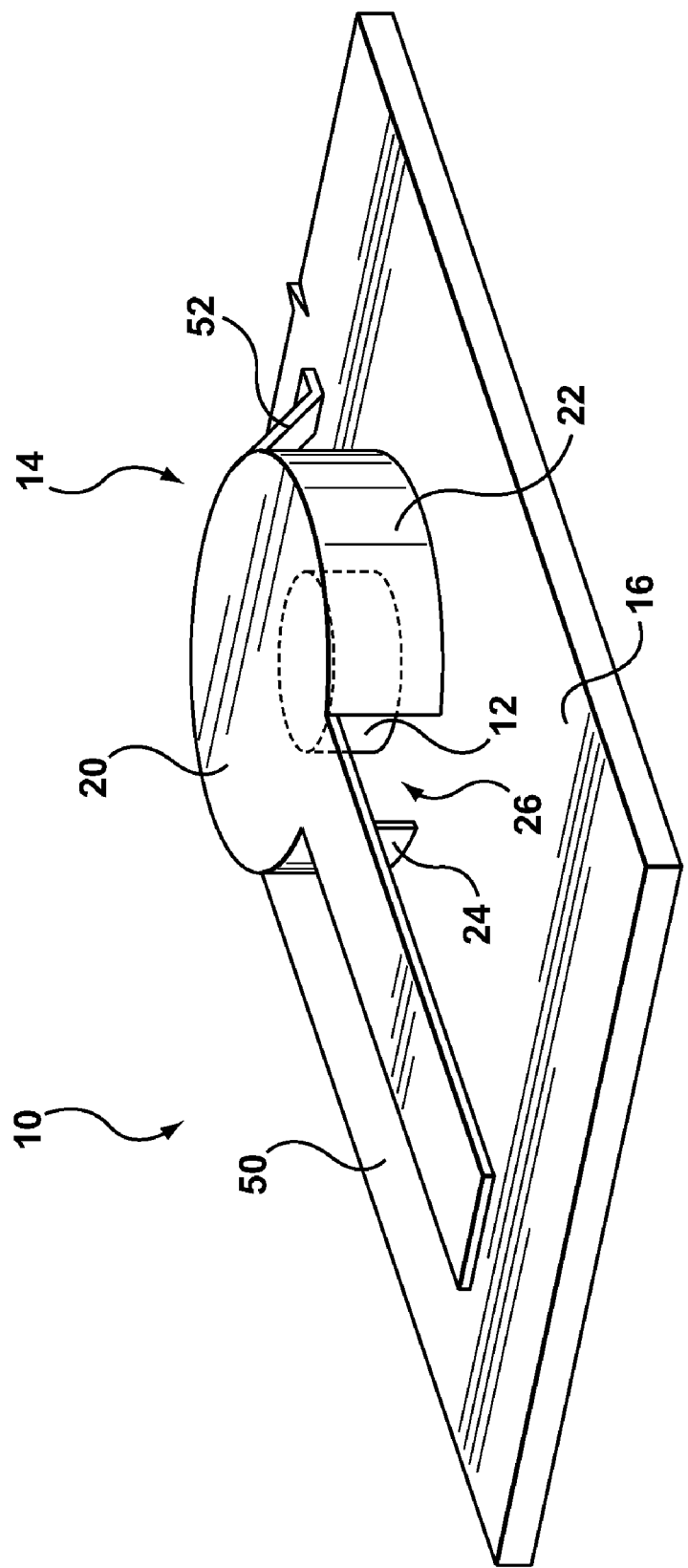
FIG. 4 shows a perspective view of the antenna of FIG. 1.

A top plan view of the antenna 10 is shown in FIG. 2. FIG. 3 shows a front view of the antenna 10, and FIG. 4 shows a perspective view.

The microphone 12 is protected from ESD events by the ESD shield 14. The ESD shield 14 is a metal covering or casing connected to a ground plane or trace on the circuit board 16. In FIGS. 1-4 the microphone 12 is shown as a cylindrical element for ease of illustration. Those skilled in the art will appreciate that the microphone 12 is not necessarily cylindrical and is not necessarily arranged on the circuit board 16 in the manner illustrated in FIGS. 1-4.

The ESD shield 14 generally covers the microphone 12, and, in the illustrated embodiment, has a top section 20, and side sections 22, 24. At the front of the ESD shield 14, the side sections 22, 24 are separated to define an acoustic opening or port 26 through which the microphone 12 may receive acoustic waves. The interior of the ESD shield 14 creates an acoustic cavity. At least one of the side sections 22, 24 is connected to electrical ground. For example, one or both of the side sections 22, 24 may be directly connected to a ground plane on or within the printed circuit board 16 or substrate to which the microphone 12 is mounted. Because the ESD shield 14 is grounded, it protects the microphone 12 from spurious ESD events and from electromagnetic interference. In many embodiments, this may eliminate the need for TVS diode protection, which may reduce the cost associated with the microphone 12.

Figure 5:
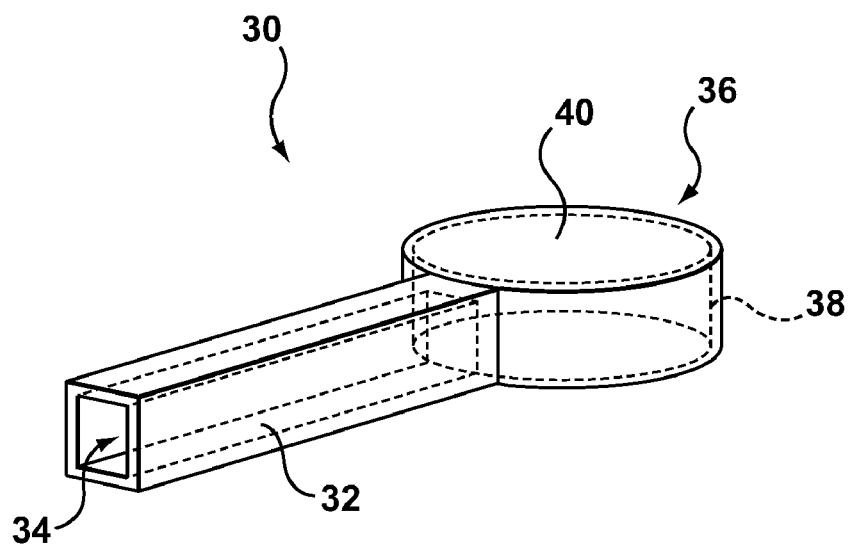
FIG. 5 shows a perspective view of an example embodiment of an acoustic shield for use with the microphone.

Reference is now made to FIG. 5, which shows a perspective view of an example embodiment of an acoustic shield 30 for use with the microphone 12. The acoustic shield 30 is intended to shield the microphone 12 from unwanted acoustic interference and/or reflections but permit desired voice range acoustic waves to be received through the acoustic port 26.

The acoustic shield 30 includes a non-metal acoustic tube 32 for connecting the acoustic port 26 to the casing of the electronic device (not shown). The acoustic tube 32 is formed from rubber or other suitable material. The acoustic tube 32 provides a pathway 34 for acoustic waves to travel from a port or opening in the exterior casing of the device to the acoustic port 26 in the ESD shield 14. Although the tube 32 is straight in many embodiments, in some embodiments it may be possible for the tube 32 to have bends or curves provided that its interior dimensions and angles permit a reasonably efficient transfer of sound in the voice range down the pathway 34 of the tube 32. The end of the tube 32 at the casing may be sealed to the casing.

In some embodiments the acoustic shield 30 includes a cavity portion 36 sized to fit within the ESD shield 14 and substantially surround the microphone 12. It will be appreciated that the cavity portion 36 does not pass underneath the microphone 12 where the microphone 12 is attached to the circuit board 16, but rather fits on top of the microphone 12. The interior of the cavity portion 36 is dimensioned so that the tube resonance is above the audio band used in telephony.

The interior of the cavity portion 36 is in sealed communication with the pathway 34 of the tube 32 to permit sound transfer down the pathway 34 to the interior of the cavity portion 36 and, thus, the microphone 12. The cavity portion 36 may otherwise have a sidewall 38 and top wall 40 that substantially surrounds the microphone 12.

Those ordinarily skilled in the art will appreciate the range of suitable materials that may be employed to create the acoustic shield 30.

Referring still to FIGS. 1 to 5, the antenna 10 includes a radiator arm 50 and a feed element 52. The radiator arm 50 is, in this embodiment, a metal planar element. The radiator arm 50 may, in some embodiments, be formed integrally with the ESD shield 14. In this particular embodiment, the radiator arm 50 lies in the same plane as the top section 20 of the ESD shield 14. The feed element 52 is a metal element connected to approximately the opposite side of the top section 20 from the radiator arm 50. The feed element 52 extends down to the circuit board 16 or other substrate where it connects to a signal trace or other circuit element through which it may electrically conduct received or transmitted signals. In the embodiment shown in FIGS. 1-4, the feed element 52 extends downwards at an acute angle; however, in other embodiments it may extend downwards perpendicular to the top section 20.

The radiator arm 50 may be arranged to extend partly or wholly above the acoustic tube 32 (FIG. 5). In some embodiments the radiator arm 50 may be wider, thinner or the same width as the acoustic tube 32. In some embodiments the radiator arm 50 is the same or shorter than the length of the acoustic tube 32. The length and width of the radiator arm 50 are selected in conjunction with the dimensions of the top section 20 and the feed element 52 to give the antenna 10 the desired RF properties. The length and width of the radiator arm 50 may be selected so as to frequency tune the antenna 10.

The radiator arm 50, ESD shield 14, and feed element 52 are, in one embodiment, formed from a metal stamping process.

Figure 6:
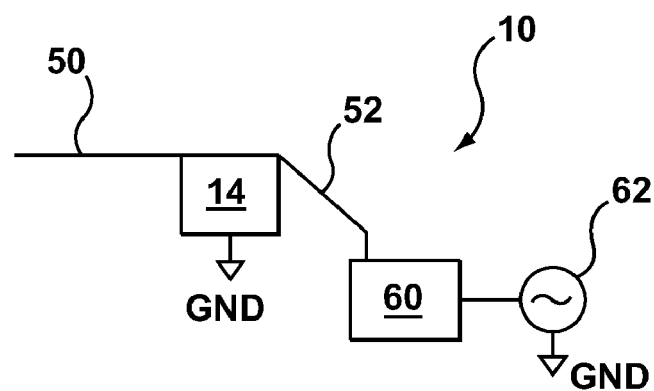
FIG. 6 shows a block diagram of the antenna.

Reference is now also made to FIG. 6, which shows a block diagram of the antenna 10. The antenna 10 is formed from the radiator arm 50, the grounded ESD shield 14, and feed element 52. The ESD shield 14, in particular the top section 20, serves as a shorted element of the antenna 10. Either one of the sides 22, 24 of the ESD shield 14 or both sides 22, 24 may be connected to ground. The feed element 52 is connected to a signal trace or circuit element connected to a matching block 60. The matching circuit 60 is configured to impedance match with the antenna 10, as will be understood by those skilled in the art. The matching circuit 60 may, in some embodiments, be implemented using integrated passive devices (IPDs).

The feed element 52 is coupled to a signal source 62 through the matching circuit 60. The signal source 62 is configured to drive the antenna 10 at one or more frequencies to which the antenna 10 is tuned. Those ordinarily skilled in the art will appreciate the range of circuit elements and variations on configuration for using an RF antenna such as the antenna 10 for sending or receiving RF signals.

It will be appreciated that the antenna 10 shown in FIG. 6 and in FIGS. 1-4 is configured as an Inverted-F antenna. In other embodiments other microstrip antennas may be implemented. It will be understood that the antenna 10 discussed herein is an example only. Other embodiments of antennas integrated with the ESD shield of a microphone may include multiple feed points, multiple shorting elements, slots, or parasitic elements. It will also be understood that the radiator arm 50 may, in some embodiments, be folded and/or non-planar. For example, the radiator arm 50 may be arranged as a folded three-dimensional structure. In one embodiment, the radiator arm 50 may have elements arranged along one or more of the sides of the acoustic tube 32.

Reference will now be made to FIGS. 7 through 11, which illustrate other example embodiments of the antenna 10.

Figure 7:
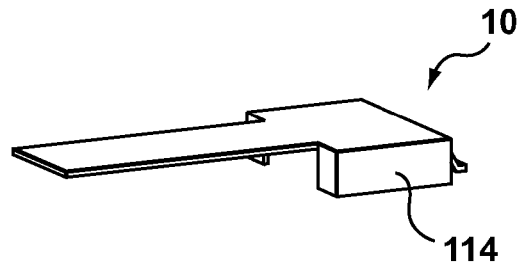
FIGS. 7 through 11 show additional example embodiments of the antenna.

FIG. 7 shows a perspective view of an embodiment of the antenna 10 with a non-cylindrical ESD shield 114. In this embodiment, the ESD shield 114 is rectangular. In other embodiments, the ESD shield 114 may be arranged in other shapes.

Figure 8:
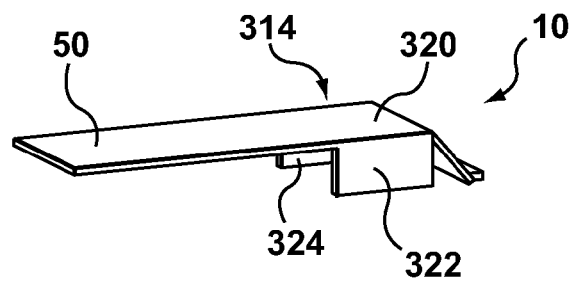

FIG. 8 shows a perspective view of an embodiment of the antenna 10 with an ESD shield 314 having the same width as the radiator arm 50. In this embodiment, the top section 320 of the ESD shield 314 has the same width as the radiator arm and is generally rectangular in shape. The sides 322, 324 of the ESD shield 314 extend downwards from the top section 320 and the acoustic opening or port 326 occupies the entire front of the ESD shield 314.

Figure 9:
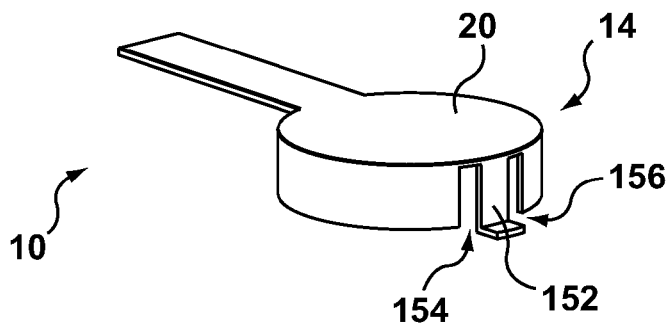

FIG. 9 shows a right front perspective view of yet another embodiment of the antenna 10. In this embodiment, the ESD shield 14 is cylindrical, like in FIGS. 1-4; however, the feed element 152 in this embodiment extends perpendicular to the top portion 20. Gaps 154, 156 between the feed element 152 and the sides of the ESD shield 14 prevent the feed element 152 from being shorted out in this embodiment.

Figure 10:
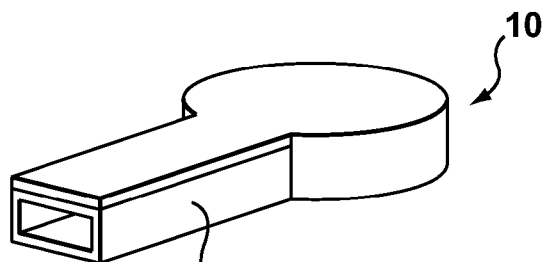

FIG. 10 illustrates an embodiment of the antenna 10 of FIGS. 1-4 arranged together with the acoustic tube 32 of FIG. 5. The acoustic tube 32 is shown in dashed lines for ease of illustration. In this embodiment, the radiator arm 52 substantially covers the top of the acoustic tube 32 and has nearly the same length as the acoustic tube 32.

Figure 11:
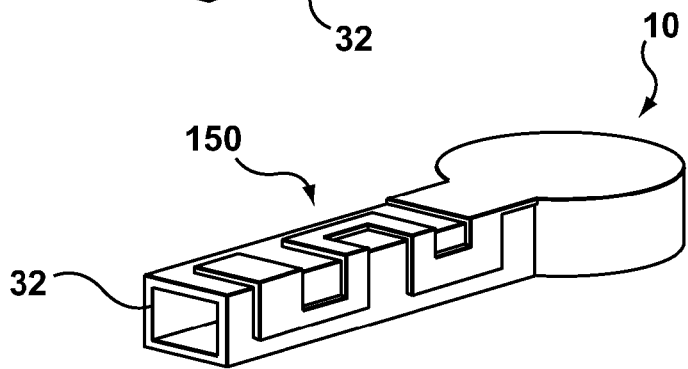

FIG. 11 shows another embodiment of the antenna 10 together with the acoustic tube 32. In this embodiment, the radiator arm 150 is formed as a folded three-dimensional structure. The radiator arm 50 features portions on the top of the acoustic tube 32 and interconnecting portions on one or more of the sides of the acoustic tube 32, so as to form a winding or switchback pattern in three-dimensions.

In the foregoing embodiments, the radiator arm 50 is shown lying in the same plane as the top section 20 of the ESD shield 14. In other embodiments, the radiator arm 50 may extend in a different plane from the top section 20. As noted in connection with FIG. 11, the radiator arm 50 may have a three-dimensional shape. In addition, although the top section 20 is illustrated as being planar in many of the embodiments, in some embodiments the top section 20 may not be planar.

Those ordinarily skilled in the art will appreciated that the foregoing embodiments are examples only and that many other configurations or shapes may be used to form the ESD shield, radiator arm, and/or feed element of the antenna, depending on the application desired.

Figure 12:
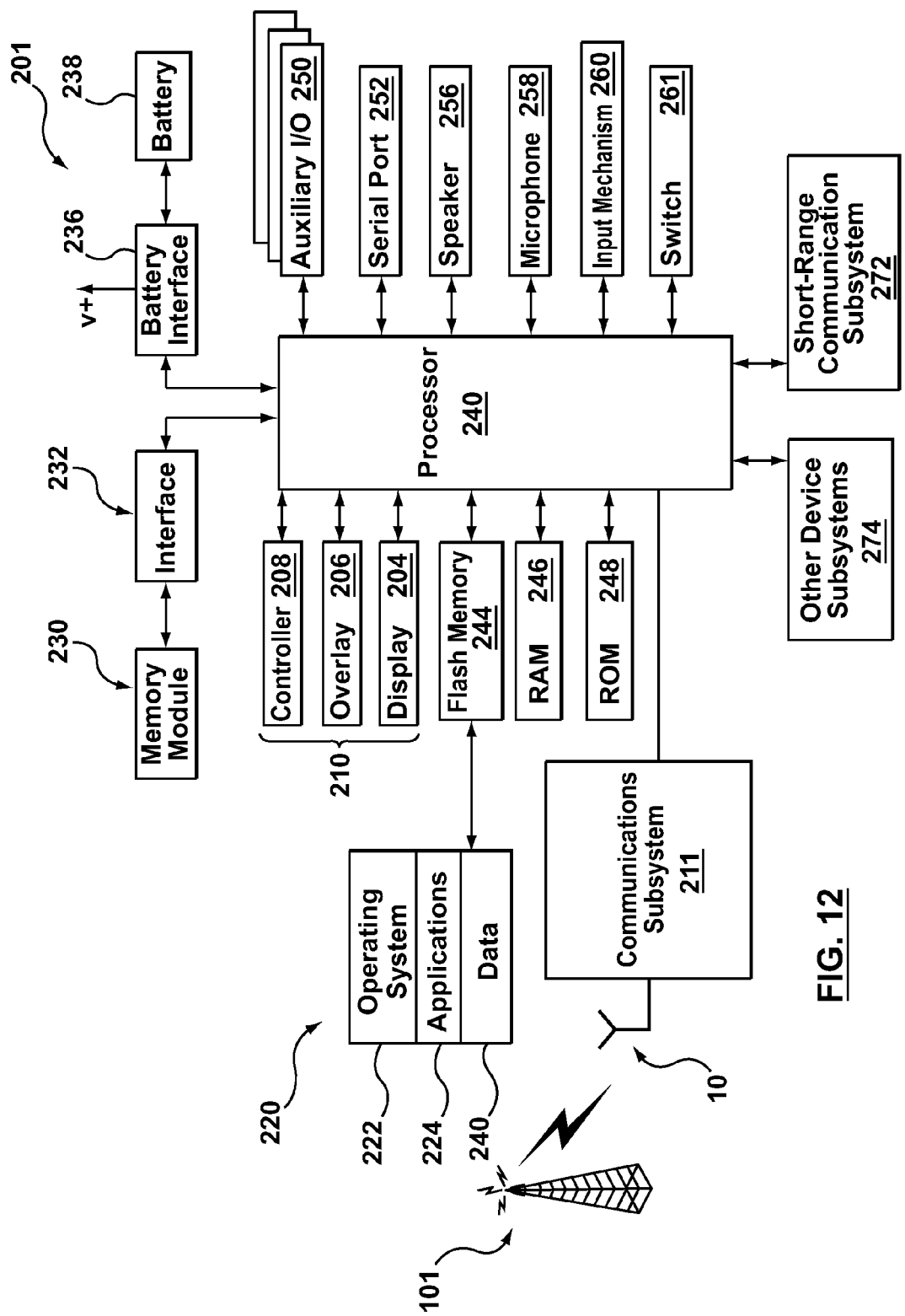
FIG. 12 shows a block diagram of a handheld electronic device incorporating the antenna.

Reference is now made to FIG. 12, which shows an example embodiment of a mobile communication device 201 which may incorporate the antenna 10 described herein. The mobile communication device 201 is a two-way communication device having voice and possibly data communication capabilities; for example, the capability to communicate with other computer systems, e.g., via the Internet. Depending on the functionality provided by the mobile communication device 201, in various embodiments the device may be a multiple-mode communication device configured for both data and voice communication, a smartphone, a mobile telephone or a PDA (personal digital assistant) enabled for wireless communication, or a computer system with a wireless modem.

The mobile communication device 201 includes a controller comprising at least one processor 240 such as a microprocessor which controls the overall operation of the mobile communication device 201, and a wireless communication subsystem 211 for exchanging radio frequency signals with the wireless network 101. The processor 240 interacts with the communication subsystem 211 which performs communication functions. The processor 240 interacts with additional device subsystems. In some embodiments, the device 201 may include a touchscreen display 210 which includes a display (screen) 204, such as a liquid crystal display (LCD) screen, with a touch-sensitive input surface or overlay 206 connected to an electronic controller 208. The touch-sensitive overlay 206 and the electronic controller 208 provide a touch-sensitive input device and the processor 240 interacts with the touch-sensitive overlay 206 via the electronic controller 208. In other embodiments, the display 204 may not be a touch-screen display. Instead, the device 201 may simply include a non-touch display and one or more input mechanisms, such as, for example, a depressible scroll wheel.

The processor 240 interacts with additional device subsystems including flash memory 244, random access memory (RAM) 246, read only memory (ROM) 248, auxiliary input/output (I/O) subsystems 250, data port 252 such as serial data port, such as a Universal Serial Bus (USB) data port, speaker 256, microphone 258, input mechanism 260, switch 261, short-range communication subsystem 272, and other device subsystems generally designated as 274. Some of the subsystems shown in FIG. 12 perform communication-related functions, whereas other subsystems may provide "resident" or on-device functions.

The communication subsystem 211 may include a receiver, a transmitter, and associated components, such as one or more antenna elements 10, local oscillators (LOs), and a processing module such as a digital signal processor (DSP). The antenna 10 may be embedded or internal to the mobile communication device 201 and a single antenna may be shared by both receiver and transmitter, as is known in the art. As will be apparent to those skilled in the field of communication, the particular design of the communication subsystem 211 depends on the wireless network 101 in which the mobile communication device 201 is intended to operate. As described above, the antenna 10 may be formed integral with the microphone 258 ESD protection.

The mobile communication device 201 may communicate with any one of a plurality of fixed transceiver base stations of a wireless network 101 within its geographic coverage area. The mobile communication device 201 may send and receive communication signals over the wireless network 101 after a network registration or activation procedures have been completed. Signals received by the antenna 10 through the wireless network 101 are input to the receiver, which may perform such common receiver functions as signal amplification, frequency down conversion, filtering, channel selection, etc., as well as analog-to-digital (A/D) conversion. A/D conversion of a received signal allows more complex communication functions such as demodulation and decoding to be performed in the DSP. In a similar manner, signals to be transmitted are processed, including modulation and encoding, for example, by the DSP. These DSP-processed signals are input to the transmitter for digital-to-analog (D/A) conversion, frequency up conversion, filtering, amplification, and transmission to the wireless network 101 via the antenna 10.

The processor 240 operates under stored program control and executes software modules 220 stored in memory such as persistent memory, for example, in the flash memory 244. As illustrated in FIG. 12, the software modules 220 comprise operating system software 222 and software applications 224.

Those skilled in the art will appreciate that the software modules 220 or parts thereof may be temporarily loaded into volatile memory such as the RAM 246. The RAM 246 is used for storing runtime data variables and other types of data or information, as will be apparent to those skilled in the art. Although specific functions are described for various types of memory, this is merely one example, and those skilled in the art will appreciate that a different assignment of functions to types of memory could also be used.

The software applications 224 may include a range of other applications, including, for example, a messaging application, a calendar application, and/or a notepad application. In some embodiments, the software applications 224 include an email message application, a push content viewing application, a voice communication (i.e. telephony) application, a map application, and a media player application. Each of the software applications 224 may include layout information defining the placement of particular fields and graphic elements (e.g. text fields, input fields, icons, etc.) in the user interface (i.e. the display device 204) according to the application.

In some embodiments, the auxiliary input/output (I/O) subsystems 250 may comprise an external communication link or interface, for example, an Ethernet connection. The mobile communication device 201 may comprise other wireless communication interfaces for communicating with other types of wireless networks, for example, a wireless network such as an orthogonal frequency division multiplexed (OFDM) network or a GPS transceiver for communicating with a GPS satellite network (not shown). The auxiliary I/O subsystems 250 may comprise a vibrator for providing vibratory notifications in response to various events on the mobile communication device 201 such as receipt of an electronic communication or incoming phone call, or for other purposes such as haptic feedback (touch feedback).

In some embodiments, the mobile communication device 201 also includes a removable memory card 230 (typically comprising flash memory) and a memory card interface 232. Network access may be associated with a subscriber or user of the mobile communication device 201 via the memory card 230, which may be a Subscriber Identity Module (SIM) card for use in a GSM network or other type of memory card for use in the relevant wireless network type. The memory card 230 is inserted in or connected to the memory card interface 232 of the mobile communication device 201 in order to operate in conjunction with the wireless network 101.

The mobile communication device 201 stores data 240 in an erasable persistent memory, which in one example embodiment is the flash memory 244. In various embodiments, the data 240 includes service data comprising information required by the mobile communication device 201 to establish and maintain communication with the wireless network 101. The data 240 may also include user application data such as email messages, address book and contact information, calendar and schedule information, notepad documents, image files, and other commonly stored user information stored on the mobile communication device 201 by its user, and other data. The data 240 stored in the persistent memory (e.g. flash memory 244) of the mobile communication device 201 may be organized, at least partially, into a number of databases each containing data items of the same data type or associated with the same application.

The serial data port 252 may be used for synchronization with a user's host computer system (not shown). The serial data port 252 enables a user to set preferences through an external device or software application and extends the capabilities of the mobile communication device 201 by providing for information or software downloads to the mobile communication device 201 other than through the wireless network 101. The alternate download path may, for example, be used to load an encryption key onto the mobile communication device 201 through a direct, reliable and trusted connection to thereby provide secure device communication.

In some embodiments, the mobile communication device 201 is provided with a service routing application programming interface (API) which provides an application with the ability to route traffic through a serial data (i.e., USB) or Bluetooth® (Bluetooth® is a registered trademark of Bluetooth SIG, Inc.) connection to the host computer system using standard connectivity protocols. When a user connects their mobile communication device 201 to the host computer system via a USB cable or Bluetooth® connection, traffic that was destined for the wireless network 101 is automatically routed to the mobile communication device 201 using the USB cable or Bluetooth® connection. Similarly, any traffic destined for the wireless network 101 is automatically sent over the USB cable Bluetooth® connection to the host computer system for processing.

The mobile communication device 201 also includes a battery 238 as a power source, which is typically one or more rechargeable batteries that may be charged, for example, through charging circuitry coupled to a battery interface such as the serial data port 252. The battery 238 provides electrical power to at least some of the electrical circuitry in the mobile communication device 201, and the battery interface 236 provides a mechanical and electrical connection for the battery 238. The battery interface 236 is coupled to a regulator (not shown) which provides power V+ to the circuitry of the mobile communication device 201.

The short-range communication subsystem 272 is an additional optional component which provides for communication between the mobile communication device 201 and different systems or devices, which need not necessarily be similar devices. For example, the subsystem 272 may include an infrared device and associated circuits and components, or a wireless bus protocol compliant communication mechanism such as a Bluetooth® communication module to provide for communication with similarly-enabled systems and devices.

A predetermined set of applications that control basic device operations, including data and possibly voice communication applications will normally be installed on the mobile communication device 201 during or after manufacture. Additional applications and/or upgrades to the operating system 221 or software applications 224 may also be loaded onto the mobile communication device 201 through the wireless network 101, the auxiliary I/O subsystem 250, the serial port 252, the short-range communication subsystem 272, or other suitable subsystem 274 other wireless communication interfaces. The downloaded programs or code modules may be permanently installed, for example, written into the program memory (i.e. the flash memory 244), or written into and executed from the RAM 246 for execution by the processor 240 at runtime. Such flexibility in application installation increases the functionality of the mobile communication device 201 and may provide enhanced on-device functions, communication-related functions, or both. For example, secure communication applications may enable electronic commerce functions and other such financial transactions to be performed using the mobile communication device 201.

Although in this embodiment, it is the communication subsystem 211 that employs the antenna 10 integrated with the microphone 258 ESD protection, in other embodiments a different communication system within the mobile device 201 may use an antenna integrated with the microphone 258 ESD protection, such as a GPS system, or the short-range communication subsystem 272.

The wireless network 101 may comprise one or more of a Wireless Wide Area Network (WWAN) and a Wireless Local Area Network (WLAN) or other suitable network arrangements. In some embodiments, the mobile communication device 201 is configured to communicate over both the WWAN and WLAN, and to roam between these networks. In some embodiments, the wireless network 101 may comprise multiple WWANs and WLANs. In some embodiments, the mobile device 201 includes the communication subsystem 211 for WWAN communications and a separate communication subsystem for WLAN communications. In most embodiments, communications with the WLAN employ a different antenna than communications with the WWAN. Accordingly, the antenna 10 may be configured for WWAN communications or WLAN communications depending on the embodiment and desired application.

In some embodiments, the WWAN conforms to one or more of the following wireless network types: Mobitex Radio Network, DataTAC, GSM (Global System for Mobile Communication), GPRS (General Packet Radio System), TDMA (Time Division Multiple Access), CDMA (Code Division Multiple Access), CDPD (Cellular Digital Packet Data), iDEN (integrated Digital Enhanced Network), EvDO (Evolution-Data Optimized) CDMA2000, EDGE (Enhanced Data rates for GSM Evolution), UMTS (Universal Mobile Telecommunication Systems), HSPDA (High-Speed Downlink Packet Access), IEEE 802.16e (also referred to as Worldwide Interoperability for Microwave Access or "WiMAX), or various other networks. Although WWAN is described as a "Wide-Area" network, that term is intended herein also to incorporate wireless Metropolitan Area Networks (WMAN) and other similar technologies for providing coordinated service wirelessly over an area larger than that covered by typical WLANs.

The WLAN comprises a wireless network which, in some embodiments, conforms to IEEE 802.11x standards (sometimes referred to as Wi-Fi) such as, for example, the IEEE 802.11a, 802.11b and/or 802.11g standard. Other communication protocols may be used for the WLAN in other embodiments such as, for example, IEEE 802.11n, IEEE 802.16e (also referred to as Worldwide Interoperability for Microwave Access or "WiMAX"), or IEEE 802.20 (also referred to as Mobile Wireless Broadband Access). The WLAN includes one or more wireless RF Access Points (AP) that collectively provide a WLAN coverage area.

Certain adaptations and modifications of the described embodiments can be made. Therefore, the above discussed embodiments are considered to be illustrative and not restrictive.

What is claimed is:

1. A mobile communication device comprising:
   a substrate having a ground plane and an antenna signal trace;
   a microphone mounted to the substrate;
   a metallic shield disposed over the microphone and being connected to the ground plane, the metallic shield including:
      a planar top section disposed substantially parallel to the substrate and spaced above the microphone; and
      at least two side walls extending downwards from the edges of the planar top section, and wherein at least one of the side walls is connected to the ground plane; and
   a radio frequency antenna formed in part from the metallic shield and having at least one radiator arm including a planar metal element having one end connected to the planar top section of the metallic shield, such that the planar metal element and the planar top section lie in the same plane,
   wherein the antenna includes a feed point connected to the antenna signal trace.

2. The mobile communication device claimed in claim 1, further including a non-metallic acoustic tube disposed at least partly under the radiator arm.

3. The mobile communication device claimed in claim 2, further including a device casing, the device casing having an acoustic opening, and wherein the non-metallic acoustic tube defines an acoustic pathway between the acoustic opening and the microphone.

4. The mobile communication device claimed in claim 1, wherein the antenna includes a feed element having one end connected to the top section and another end connected to the antenna signal trace.

5. The mobile communication device claimed in claim 1, wherein the antenna includes a feed element having one end connected to the metallic shield and another end connected to the antenna signal trace.

6. The mobile communication device claimed in claim 1, wherein the side walls define an acoustic port through which the microphone is exposed to the environment external to the device.

7. The mobile communication device claimed in claim 6, further including a non-metallic acoustic shield within the metallic shield and over the microphone, and wherein the non-metallic acoustic shield includes an acoustic tube extending from the acoustic port and disposed at least partly under the radiator arm.

8. The mobile communication device claimed in claim 1, wherein the substrate comprises a printed circuit board.

9. A mobile communications device comprising:
   a device casing having an acoustic microphone opening;
   a substrate within the device casing, the substrate having an electrical ground and a signal trace;
   a microphone mounted to the substrate;
   an electrostatic discharge shield disposed over the microphone and connected to the electrical ground, the electrostatic discharge shield defining an acoustic port; and
   an antenna having a radiator arm integrally formed with the electrostatic discharge shield and a feed element connected to the electrostatic discharge shield, and wherein the feed element is further connected to the signal trace.

10. The mobile communications device claimed in claim 9, wherein the acoustic port is located below the radiator arm, and further including a non-metallic acoustic tube disposed beneath the radiator arm and defining an acoustic pathway between the acoustic microphone opening and the acoustic port.

11. The mobile communications device claimed in claim 9, wherein the microphone comprises an electret condenser microphone.

12. The mobile communications device claimed in claim 9, wherein the electrostatic discharge shield is cylindrical and includes a substantially circular planar top portion.

13. The mobile communications device claimed in claim 9, wherein the feed element and the electrostatic discharge shield are integrally formed.

14. The mobile communications device claimed in claim 13, wherein the radiator arm, the feed element, and the electrostatic discharge shield are formed from a single metal sheet in a stamping process.

* * * * *